(12) United States Patent
Hegarty et al.

(10) Patent No.: US 7,557,368 B2
(45) Date of Patent: Jul. 7, 2009

(54) SEMICONDUCTOR PHOTODETECTOR (75) Inventors: John Hegarty, Dublin (IE); Liam Paul Barry, Dublin (IE); Herve Armel Francois Folliot, Rennes (FR); James Christopher O'Gorman, Dublin (IE)

(73) Assignee: The Provost, Fellows and Scholars of the College of the Holy and Undivided Trinity of Queen Elizabeth Near Dublin, Dublin (IE)

( * ) Notice: Subject to any disclaimer, the term of this patent is extended or adjusted under 35 U.S.C. 154(b) by 322 days.

(21) Appl. No.: 10/506,106

(22) PCT Filed: Mar. 3, 2003

(86) PCT No.: PCT/IE03/00030

§ 371 (c)(1),
(2), (4) Date: Nov. 30, 2004

(87) PCT Pub. No.: WO03/075362

PCT Pub. Date: Sep. 12, 2003

(65) Prior Publication Data

US 2005/0104064 A1    May 19, 2005

(30) Foreign Application Priority Data

Mar. 1, 2002    (IE)    ................................ S2002/0158

(51) Int. Cl.
*H01L 29/205*    (2006.01)

(52) U.S. Cl. .......................... 257/21; 257/184; 257/436; 257/458; 257/464; 257/E31.019

(58) Field of Classification Search .................... 257/21
See application file for complete search history.

(56) References Cited

U.S. PATENT DOCUMENTS 4,558,923 A * 12/1985 Hoffman et al. ............ 359/243

(Continued)

OTHER PUBLICATIONS

H. Folliot, et al.: "Two-Photon Absorption Photocurrent Enhancement in Bulk ALGAAS Semiconductor Microcavities", Applied Physics Letters, American Institute of Physics, New York, US, vol. 80, NR. 8, pp. 1328-1330 XP001104777, ISSN: 0003-6951.

(Continued)

*Primary Examiner*—Jerome Jackson, Jr.
(74) *Attorney, Agent, or Firm*—Sughrue Mion, PLLC (57) ABSTRACT

A semiconductor photodetector (1) for detecting short duration laser light pulses of predetermined wavelength in a light signal (2) comprises a micro-resonator (3) of vertical Fabry-Perot construction having a Bragg mirror pair, namely, a front mirror (5) and a rear mirror (6) with an active region (8) located between the front and rear mirrors (5,6). An N-type substrate (11) supports the rear mirror (6). The light signal (2) is directed into the active region (8) through the front mirror (5) while a pump beam (17) is directed into the active region (8) at an end (18) thereof. The spacing between the front and rear mirrors (5,6) is such as to cause light of the predetermined wavelength to resonate between the mirrors (5,6). The semiconductor material of the active region (8) is selected so that one photon from each of the light signal (2) and the pump beam (17) are required to transfer one electron from a valence band (21) of the active region (8) across a bandgap (22) to a conduction band (20) so that the active region operates on the principle of Two-Photon Absorption. On the active region (8) being simultaneously subjected to the pump beam and light of the predetermined wavelength in the light signal (2) electrons are transferred by Two-Photon Absorption from the valence band (21) to the conduction band (20), thus causing a change in the voltage developed across the active region (8). The change in voltage is detected between an electrode (15) on the substrate (11) and electrodes (8) on the front mirror (5) thereby indicating the presence of light of the predetermined wavelength in the light signal (2).

22 Claims, 5 Drawing Sheets

U.S. PATENT DOCUMENTS 5,828,679 A * 10/1998 Fisher .......................... 372/6
6,741,619 B1 * 5/2004 Thoen et al. .................. 372/18
6,819,694 B2 * 11/2004 Jiang et al. ............. 372/45.013

OTHER PUBLICATIONS

T. Knodel, et al.: "RCE Photodectors Based on VCSEL Structures", IEEE Photonics Technology Letters, vol. 11, No. 10, Oct. 10, 1999, pp. 1289-1291, XP0008880917, p. 1289, col. 2, line 3-line 21.

B.C. Thomsom, et al. "Ultrahigh Speed all-optical demltiplexing base don two-[hoton absorption in a laser diode" Electronics Letters, vol. 34, No. 19, Sep. 17, 1998, pp. 1871-1872, XP000853435.

T. K. Liang et al.: "Silicon Waveguide Two-Photon Absorption Detector at 1.5 MUM Wavelength for Autocorrelation Measurements", Applied Physics Letters, American Institute of Physics, New York, US, vo., 81, NR. 7, pp. 1323-1325, XP00114221, ISSN: 0003-6951.

H. Folliot, et al.: "Two-Photom Absorption Photocurrent Enhancement in Bulk ALGAAS Semiconductor Microcavities", Applied Physics Letters, American Institute of Physics, New York, US, vol. 80, NR. 8, pp. 1328-1330 XP001104777, ISSN: 0003-6951.

T. Knodel, et al.: "RCE Photodectors Based on VCSEL Structures", IEEE Photonics Technology Letters, vol. 11, No. 10, Oct. 10, 1999, pp. 1289-1291, XP0008880917, p. 1289, column 2, line 3-line 21.

B.C. Thomson, et al." Ultrahigh Speed all-optical demltiplexing base don two-[hoton absorption in a laser diode" Electronics Letters, vol. 34, No. 19, Sep. 17, 1998, pp. 1871-1872, XP000853435.

T. K. Liang et al.: "Silicon Waveguide Two-Photon Absorption Detector at 1.5 MUM Wavelength for Autocorrelation Measurements", Applied Physics Letters, American Institute of Physics, New York, US, vo., 81 NR. 7, pp. 1323-1325, XP001 142221, ISSN: 0003-6951.

L. Cuadra et al.: "Starin Considerations for the Design of the Quantum DOT Intermediate Band Solar Cell in the GaxInI-xAs/AlyGal-yAs Material System", 17th E.X. Photovaltaic Solar Energy Conference, Munich: WIP-Renewable Energies, DE, vol. 1 of 3, Conf. 17, pp. 98-101, Xp001139372; ISBN: 3-936338-08-6.

* cited by examiner

SEMICONDUCTOR PHOTODETECTOR

This is a National Stage entry of Application No. PCT/IE03/00030 filed Mar. 3, 2003; the disclosure of which is incorporated herein by reference.

BACKGROUND OF THE INVENTION

The present invention relates to a semiconductor photodetector for detecting light of a predetermined wavelength, and in particular, for detecting light relatively rapidly of the predetermined wavelength. The invention also relates to a switch incorporating the semiconductor photodetector of the invention.

In picosecond optical chronoscopy, correlation based measurements are often made for determining the presence of pulsed light. Such correlation measurements require a material with high efficiency for a non-linear detection of light, for example, lithiumniobate for second harmonic detection, where a first pulse of light, namely, the light the presence of which is to be detected, to be compared with a second pulse of light or with a delayed version of the first pulse, in order to measure the temporal characteristics of that first pulse of light. If the second light pulse with which the first light pulse is being compared is a delayed version of the first light pulse, then the process is referred to as correlation. If, on the other hand, the second light pulse with which the first light pulse is being compared is derived from a light source different to that from which the first light pulse emanated, then this process is properly referred to as cross-correlation. However, in general, a distinction between correlation and cross-correlation is often not made, and both forms of correlation are referred to as correlation. In this specification the use of the term "correlation" is intended to refer to both auto and cross-correlation. Correlation measurements can be performed in two ways, most common is a time averaged method where the average signal from a regular pulse train is measured using a slow non-linear detector, since due to the low efficiency of the non-linear processes used, real time correlation measurements can be made where the correlation signal is measured in real time, but requires a high efficiency of the non-linear process.

Devices for carrying out correlation measurements of light signals which comprise laser pulses of picoseconds and sub-picoseconds duration are known. For example, recently semi-conductor devices which operate on the principle of Two-Photon Absorption have been demonstrated to be suitable for carrying out time averaged correlation measurements. Such an arrangement is described by Skovgaard et al, in 1998 *Optics Communications*, Vol. 153, pp. 78-82, 'Two-photon conductivity in semiconductor waveguide autocorrelators'. In general, such Two-Photon Absorption semiconductor devices do not provide high sensitivity characterisation of light signals of short optical pulses in real time, since such devices require that the light of the light signal be of relatively high optical intensity in order to obtain a significant level of photocurrent and to exceed residual linear absorption, and thus to provide the sensitivity required. One known technique for increasing the sensitivity of Two-Photon Absorption devices where the light intensity of the light signal is relatively low, is to provide the light with a relatively long interaction length with the two photon absorbing material. However, this results in a reduction in the operating speed, and thus the detecting speed of the device, thus rendering such devices unsuitable for either real time or time averaged correlation measurement in the pico/sub-pico seconds range. Since correlation measurement devices are attractive for use in high speed telecommunications, which require operation in the picosecond/sub-picosecond range, known Two-Photon Absorption devices with relatively long active lengths are unsuitable for such requirements.

There is therefore a need for a semiconductor photodetector for detecting light of a predetermined wavelength which is suitable for both correlation and cross-correlation, and indeed, for other uses for detecting light of predetermined wavelength, which overcomes this problem, and there is also a need for such a device which is suitable for use in relatively high speed systems, for example, high speed telecommunication systems.

SUMMARY OF THE INVENTION

The present invention is directed towards providing such a semiconductor photodetector, and the invention is also directed towards providing a switch incorporating the semiconductor photodetector.

According to the invention there is provided a semiconductor photodetector for detecting light of a predetermined wavelength, the photodetector comprising an active semiconductor region for receiving a light signal of the predetermined wavelength, and a pump light beam, the active region defining a conduction band and at least one valence band, the conduction band defining with the valence band closest to the conduction band an energy bandgap, the width of the energy bandgap being such as to require absorption of more than one photon to effect transition of one electron from the valence band to the conduction band so that when a light signal of the predetermined wavelength is received by the active region simultaneously with the pump beam, a photon is required from each of the light signal and the pump beam for transferring an electron across the energy bandgap from the valence band to the conduction band, the photon from one of the light signal and the pump beam transferring the electron from the valence band to a virtual state between the valence band and the conduction band, and the photon from the other of the light signal and the pump beam transferring the electron from the virtual state to the conduction band for providing a detectable voltage change across the active region for indicating the presence of light of the predetermined wavelength in the light signal, wherein the active region is located in a resonator, the resonant frequency of which is selected for causing the light of the predetermined wavelength to resonate within the resonator for enhancing absorption of the light of the predetermined frequency in the active region.

In one embodiment of the invention absorption of two photons is required to effect transition of one electron from the valence band to the conduction band.

In another embodiment of the invention the material of the active region is selected to have non-linear absorbing characteristics of light in the predetermined wavelength. Preferably, the material of the active region is selected so that the active region does not exhibit linear absorbing characteristics of light in the predetermined wavelength.

In one embodiment of the invention the material of the active region is selected so that the energy bandgap is such that the photon energy of the light of the predetermined wavelength is less than the energy gap of the bandgap, and the wavelength of the light of the pump beam is selected so that the photon energy of the light of the pump beam is not less than the energy gap of the bandgap less the photon energy of the light of the predetermined wavelength. Preferably, the material of the active region is selected so that the energy bandgap is such that the photon energy of the light of the predetermined wavelength is less than half of the energy gap of the bandgap. Advantageously, the light of the pump beam is selected so that the photon energy of the light is equal to the energy gap of the bandgap less the photon energy of the light of the predetermined wavelength. Ideally, the material of the active region is selected so that the energy bandgap is such that the photon energy of the light of the predetermined wavelength is just less than half of the energy gap of the bandgap.

In one embodiment of the invention the material of the active region is selected so that the width of the energy bandgap is such as to minimise single photon absorption at the predetermined wavelength.

In another embodiment of the invention the resonator is selected for simultaneously maximising detection of light of the predetermined wavelength and for preventing detection of light of other wavelengths.

In a further embodiment of the invention a pair of electrodes are provided co-operating with the active region so that the detectable voltage change across the active region resulting from detection of the light of predetermined wavelength is established between the electrodes.

In one embodiment of the invention the resonator comprises a pair of spaced apart mirrors and the active region is located between the mirrors so that light of the predetermined wavelength resonates between the mirrors across the active region. Preferably, the spacing between the mirrors is selected so that the light of the predetermined wavelength resonates between the mirrors. Advantageously, the effective spacing between the mirrors is approximately half the wavelength of the light of predetermined wavelength or a harmonic thereof. Advantageously, the effective spacing between the mirrors is approximately half the wavelength of the light of predetermined wavelength.

In one embodiment of the invention a non-active region is located between the mirrors, and the active region is located in the non-active region. Preferably, the non-active region is provided by a semiconductor material. Advantageously, the non-active region is substantially non-absorbing of light of the predetermined wavelength.

In one embodiment of the invention a plurality of active regions are provided in the non-active region at locations substantially corresponding to anti-nodes of the electromagnetic field resonating between the mirrors.

In another embodiment of the invention each active region is undoped. Alternatively, each active region is doped.

In another embodiment of the invention each active region is provided by a quantum well.

In another embodiment of the invention the material of each quantum well and their respective confinement barriers may be selected from any one or more of the following materials:
Gallium arsenide
Indium phosphide
Indium arsenide
Aluminium gallium arsenide
Gallium nitride
Aluminium nitride
Zinc selenide
Zinc sulphide
Silicon
Germanium
Gallium phosphide
Cuprous oxide.

In one embodiment of the invention the reflectivity of the respective mirrors is chosen so that the resonator is resonant at the predetermined wavelength. Preferably, the reflectivities of the respective mirrors is selected for simultaneously maximising the detection of the light of the predetermined wavelength and for preventing detection of light of other wavelengths.

In one embodiment of the invention one of the light signal and the pump beam is directed into the active region through one of the mirrors.

In another embodiment of the invention one of the light signal and the pump beam is directed perpendicularly to the mirror.

In a further embodiment of the invention the light signal and the pump beam are directed into the active region through the same mirror.

In a still further embodiment of the invention the light signal and the pump beam are directed at the same mirror at an angle to each other.

In one embodiment of the invention one of the light signal and the pump beam is directed into the active region substantially parallel to the active region.

In another embodiment of the invention the pump beam is at an angle of approximately 90° to the light signal.

In a further embodiment of the invention the reflectivity of the mirror through which the one of the light signal and the pump beam is passed is less than the reflectivity of the other mirror.

In a further embodiment of the invention the light signal is passed into the active region through one of the mirrors. Alternatively, the light signal is directed into the active region substantially parallel to the active region.

In one embodiment of the invention the reflectivities of the mirrors is selected so that light in the light signal of wavelengths other than the predetermined wavelength passes through the detector substantially unimpeded.

In another embodiment of the invention the photodetector is a direct bandgap semiconductor. Preferably, the material of the active region is selected from any one or more of the following materials and any one or more of their alloys:
Gallium arsenide
Indium phosphide
Indium arsenide
Aluminium gallium arsenide
Gallium nitride
Aluminium nitride
Zinc selenide
Zinc sulphide.

In another embodiment of the invention the semiconductor photodetector is an indirect bandgap semiconductor. Preferably, the material of the active region is selected from any one or more of the following materials and any one or more of their alloys:
Silicon
Germanium
Gallium phosphide.

In a further embodiment of the invention the semiconductor photodetector is a direct one photo forbidden bandgap detector at the wavelength of the light of the predetermined wavelength. Preferably, the material of the active region is selected from any one or more of the following materials and any one or more of their alloys:
Cuprous oxide
Silicon
Germanium.

In one embodiment of the invention the photodetector is adapted for detecting a light signal comprising pulsed light of the predetermined wavelength where the duration of each pulse is relatively short.

In another embodiment of the invention the duration of each pulse is of the order of picoseconds.

In a further embodiment of the invention the duration of each pulse is of the order of sub-picoseconds.

In a still further embodiment of the invention the duration of each pulse of the light is in the range of 1 femtosecond to 500 picoseconds.

In one embodiment of the invention the photodetector is of Fabry-Perot construction.

In another embodiment of the invention the mirrors of the photodetector are of Bragg pair construction.

In another embodiment of the invention the photodetector is of Schottky construction.

In a further embodiment of the invention the photodetector is of PIN construction.

In a still further embodiment of the invention the photodetector is of metal semiconductor metal construction.

In one embodiment of the invention the pump beam is a strobed beam.

In another embodiment of the invention the light signal is a pulsed light signal.

In another embodiment of the invention the frequency of strobing of the probe of the pump beam is substantially similar to the frequency at which the light signal is being pulsed or a harmonic thereof.

In one embodiment of the invention the resonator is a microresonator.

Additionally, the invention provides an optical switch comprising a semiconductor photodetector according to the invention wherein the photodetector is adapted for absorbing light of predetermined wavelength in a light beam comprising a plurality of co-propagating signals of respective different wavelengths, the optical switch being responsive to the light of the predetermined wavelength being absorbed for outputting an electrical signal.

The semiconductor photodetector according to the invention has many advantages. A particularly important advantage of the invention is that the photodetector according to the invention permits a light signal of predetermined wavelength of relatively low light intensity to be detected with high detection bandwidth, and significantly greater bandwidth than in non-linear photodetectors known heretofore, thus providing a photodetector which is particularly suitable for detecting light pulses of predetermined wavelength of relatively short duration, particularly of picoseconds and sub-picoseconds duration. Indeed, the photodetector is suitable for detecting light pulses of femtosecond duration. The photodetector according to the invention is capable of detecting low intensity light pulse signals of such short duration by virtue of the fact that the active region is arranged for absorbing light of the predetermined wavelength using the Two-Photon Absorption principle and the active region is located in a resonator which causes the light pulses of the predetermined wavelength to resonate therein. This significantly enhances the interaction of the light pulse with the non-linear region, and thus the absorption of light in the active region, thereby enhancing the photocurrent in the active region, and in turn the voltage change developed across the active region resulting from the Two-Photon Absorption of the light of the predetermined wavelength in the active region. Accordingly, by virtue of the fact that the intensity of the light of the pulses of the predetermined wavelength of the light signal is enhanced by the resonator, the active region can be provided by quantum wells of thickness in the nanometer range, typically, in the range five to twenty nanometers.

Since the semiconductor photodetector according to the invention is suitable for detecting light signals comprising light pulses, for example, laser light pulses of predetermined wavelength of duration of the order of picoseconds and sub-picoseconds, the semiconductor photodetector is particularly suitable for use in telecommunications, since the time duration of the pulses of light signals in telecommunications is typically of the picosecond and sub-picosecond time range, and additionally, the intensity of the light of the laser pulses can be relatively low of the order of 10 picoWatts to 20 milliwatts. The semiconductor photodetector according to the invention is suitable for use in real time and time averaged cross-correlation and autocorrelation measurements of light signals, and in particular, light signals comprising laser light pulses.

Additionally, the semiconductor photodetector according to the invention is suitable for detecting and absorbing light of the predetermined wavelength, while at the same time permitting light of other wavelengths to pass therethrough. Accordingly, the semiconductor photodetector is particularly suitable for detecting light of one wavelength in a light signal which comprises light of a plurality of other co-propagating wavelengths.

BRIEF DESCRIPTION OF THE DRAWINGS

The invention will be more clearly understood from the following description of some preferred embodiments thereof, which are given by way of example only, with reference to the accompanying drawings, in which.

SUMMARY OF THE INVENTION

Figure 1:
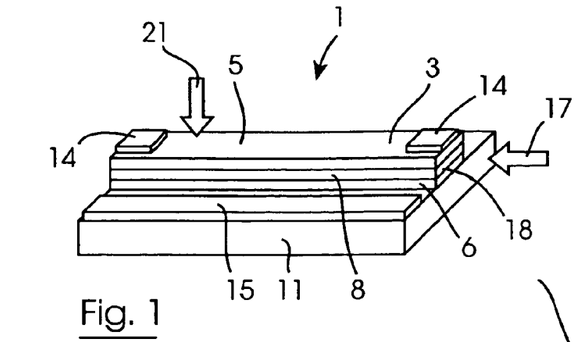
FIG. 1 is a perspective view of a semiconductor photodetector according to the invention for detecting light of a predetermined wavelength.
Figure 2:
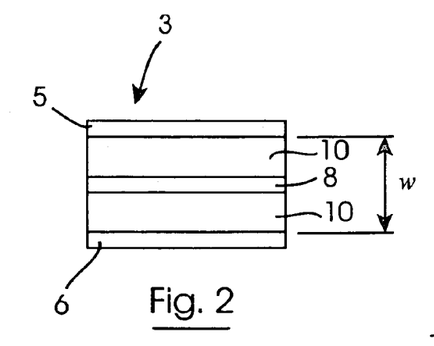
FIG. 2 is a transverse cross-sectional end elevational view of a portion of the semiconductor photodetector of FIG. 1.
Figure 3:
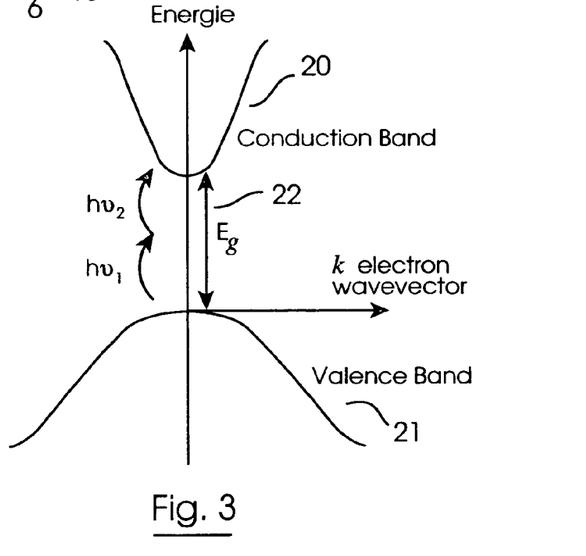
FIG. 3 is a diagrammatic representation of the mechanism for Two-Photon Absorption in the semiconductor photodetector of FIG. 1.

Referring to the drawings and initially to FIGS. 1 to 3, there is illustrated a semiconductor photodetector according to the invention indicated generally by the reference numeral 1 for detecting laser pulses of picoseconds and sub-picosecond duration of a predetermined wavelength of a laser light signal 2. The semiconductor photodetector 1 comprises a micro-resonator 3 of vertical Fabry-Pérot construction, having a Bragg mirror pair, namely, a front mirror 5 and a rear mirror 6, and a semiconductor active region 8 located in a non-active semiconductor region 10 between the front and rear mirrors 5 and 6. The rear mirror 6 is located on an N-type substrate 11. A pair of electrodes 14 are provided on the front mirror 5 at respective opposite ends thereof, and co-operate with an electrode 15 located on the substrate 11 for facilitating detection of a voltage change across the active region 8 in response to light pulses of the predetermined wavelength being detected in the light signal 2. A pump beam 17 of laser light of pre-selected wavelength as will be described below is directed into the active region 8 through an end 18 thereof. The pump beam 17 is aligned with the active region 8 and is directed parallel to the active region 8, and to the front and rear mirrors 5 and 6 for facilitating detection of pulsed laser light of the predetermined wavelength in the laser light signal 2. The laser light signal 2 is directed perpendicularly to the front mirror 5. It will of course be appreciated that due to the symmetry of the photodetector 1, the positions of the light signal 2 and the pump beam 17 may be interchanged, in other words, the light signal 2 would be directed into the active region 8 through the end 18, and the pump beam 17 would be directed into the active region 8 through the front mirror 5.

The spacing w between the front and rear mirrors 5 and 6 is selected so that laser light of the predetermined wavelength resonates between the front and rear mirrors 4 and 5, and is selected according to the equation:

$$w = \frac{m\lambda_s}{2n}$$

where $\lambda_s$ is the wavelength of the light of the predetermined wavelength, n is the effective index of refraction for light in the active and non-active regions 8 and 10, in other words the regions between the front and rear mirrors 5 and 6, and m is an integer from 1 upwards.

Additionally, the respective reflectivities of the front and rear mirrors 5 and 6 are selected so that the laser light of the predetermined wavelength resonates between the front and rear mirrors 5 and 6, while laser light in the light signal 2 of wavelengths other than the predetermined wavelength can either pass through the micro-resonator 3 substantially unimpeded and exit through the rear mirror 6 or is reflected by the micro-resonator 3. This permits the photodetector 1 to act as a filter for selecting light of the predetermined wavelength. In this embodiment of the invention the reflectivity of the front mirror 5 is selected to be slightly less than the reflectivity of the rear mirror 6.

The semiconductor material of the active region 8 is selected to exhibit non-linear absorbing characteristics of light in the predetermined wavelength, and not to exhibit linear absorbing characteristics of light in the predetermined wavelength. The semiconductor material of the non-active region 10 is selected preferably to be non-light absorbing, although it may have minor light absorbing characteristics adjacent the active region 8.

The active region 8 defines a photon conduction band 20 and at least one valence band 21 which define between them an energy bandgap 22, see FIG. 3. The material of the active region 8 is selected so that the energy bandgap 22 is given by the equation:

$$\frac{hc}{\lambda_s} < E_g < \left[\frac{hc}{\lambda_s} + \frac{hc}{\lambda_p}\right]$$

where h is Plank's constant, c is the speed of light, $\lambda_s$ is the predetermined wavelength, and $\lambda_p$ is the wavelength of the light of the pump beam.

This, thus, ensures that absorption of more than one photon, and in this case, two photons is required in order to effect transition of one electron from the valency band 21 to the conduction band 20 across the energy bandgap 22. In this embodiment of the invention the laser light of the pump beam 17 is selected to be of wavelength just less than the predetermined wavelength so that the energy of the light of the pump beam 70 is just greater than half the energy of the energy bandgap 22. Thus, when the active region 8 is simultaneously subjected to a light signal 2 with light of the predetermined wavelength and the light of the pump beam 17, one photon from each of the light of predetermined wavelength and the light of the pump beam 17 is required to transfer one electron from the valence band 21 to the conduction band 20, thus ensuring Two-Photon Absorption of the light of the predetermined wavelength in the active region 8. One photon from one of the pump beam 17 and the light of the predetermined wavelength of the light signal 2 transfers one electron from the valence band 21 to a virtual position in the energy bandgap 22, and one photon from the other of the pump beam 17 and the light of the predetermined wavelength of the light signal 2 transfers the electron from the virtual position in the energy bandgap 22 to the conduction band 20, thus providing Two-Photon Absorption in the active region 8.

The transfer of each electron from the valence band 21 to the conduction band 20 causes a change in the voltage across the active region 8 which is developed across the electrodes 14 and 15 for facilitating a determination of the detection of light of the predetermined wavelength in the light signal 2.

In use, the pump beam 17 is directed at the active region 8 at the end 18 thereof, and is set to be of wavelength just less than the predetermined wavelength, and is strobed at the pulse frequency of the predetermined wavelength in the light signal 2.

The light signal in which light of the predetermined wavelength is to be detected is directed at the detector 1 perpendicularly to the front mirror 5 so that the light signal 2 passes into the active region 8. The pulse frequency of the pump beam 17 is brought into phase with the pulses of the predetermined wavelength of the light signal 2. In general, the light signal 2 will be a pulsed light signal comprising a plurality of pulses of different wavelengths. The pulse frequencies of the light of the predetermined wavelength and the light of the other different wavelengths may be the same or different. The light pulses of wavelengths other than the predetermined wavelength pass through the active region and the rear mirror 6 out of the photodetector 1 substantially unimpeded. The light of the pulses of the predetermined wavelengths are absorbed by Two-Photon Absorption in the active region 8 when the active region 8 is simultaneously subjected to pulses of the predetermined wavelength of the light signal 2 and the strobed pulses of the pump beam 17. One electron is transferred as already described from the valence band 21 across the energy bandgap 22 to the conduction band 21 by one photon from the light of predetermined wavelength of the light signal 2 and one photon from the pump beam 17.

For performing real time Two-Photon Absorption measurements, since as the electrons are being transferred by Two-Photon Absorption from the valence band 21 to the conduction band 20 the voltage across the electrodes 14 and 15 changes, and the change in voltage indicates the presence of a light pulse of the predetermined wavelength in the light signal 2. Accordingly, by appropriately operating the pump beam 17, the duration of the light pulses can also be determined from the voltage across the electrodes 14 and 15, the width of the light pulses of predetermined wavelength being similar to the duration for which the change in the voltage developed across the electrodes 14 and 15 remains across the electrodes 14 and 15. In time averaged Two-Photon Absorption measurements, the phase shift between the pulses of the pump beam 17 and the pulses of the light of predetermined wavelength in the light signal 2 is changed and the average voltage signal is measured enabling an average measurement of the duration of the pulses of the light of the predetermined wavelength of the light signal 2 incident on the front mirror 5 of the photodetector 1.

Tests have been carried out on a computer simulation of the photodetector 1 of FIGS. 1 to 3. The simulated photodetector 1 was prepared to detect a light signal 2 comprising pulsed laser light of wavelength λ of 886.6 nanometers and pulse widths of 1.16 picosecond duration. The light of the pulses of the light signal 2 was of power in the range of $10^5$ Watts per square meter to $10^{17}$ Watts per square meter, see FIG. 4. The active region 8 was selected from undoped aluminium gallium arsenide alloy, and was provided without a quantum well. The reflectivity of the front mirror 5 was approximately 0.95, while the reflectivity of the rear mirror 6 was approximately 0.995.

The following is an explanation of the theory of the operation of the photodetector 1. In an ideally tuned Fabry-Pérot device with front and rear mirrors 5 and 6 with amplitude reflectivities of $r_1$ and $r_2$ respectively, and a front amplitude transmission $t_1$, the field enhancement factor f of a normal incident electric field $E_0$, at an antinode between the front and rear mirrors 4 and 5 is given by:

$$f = \frac{t_1(1+r_2)}{(1-r_1 r_2)}$$

The optical intensity is given by $I_0 = E_0^2 n/2Z_0$, where $Z_0$ is the vacuum impedance (~377Ω) and n is the refractive index of the medium of the active region 10. Thus, the intensity enhancement factor F (ratio between a device comprising a resonator and a device without a resonator) is then $F=f^2$ and, as the photocurrent depends on the square of the intensity, the enhancement factor of the photocurrent at the antinode is then $F^2$.

For a micro-resonator with the spacing w between the front and rear mirrors 5 and 6 being λ/n, the integrated average amplitude enhancement factor is F/2, whereas the integrated average photocurrent enhancement factor is $3F^2/8$. The ½ and ⅜ factors come from the average value of $I(z) \alpha \sin^2(k_z z)$ and $I^2(z) \alpha \sin^4(k_z z)$ integrated over a period L=λ/n respectively, where $k_z$ is the wavevector of the electromagnetic field propagation on the Z axis (see FIG. 4). Regarding Two-Photon Absorption photocurrent, the $3F^2/8$ factor can be seen as a length enhancement factor. For example, a Fabry-Pérot device with a front mirror 5 having a reflectivity of 0.95 and a rear mirror 6 having a reflectivity of 0.995 will have a length enhancement factor of around $2.5 \times 10^4$. This means that a Fabry-Pérot device with a spacing between the front and rear mirrors 5 and 6 of 0.3 μm would have the same response as a device with an active region of thickness of approximately 7.5 mm without a resonator, which could lead to a factor of ~10 reduction on the device surface (comparison between a 2*7500 μm² waveguide and a 25 μm radius vertical microresonator.

Figure 8:
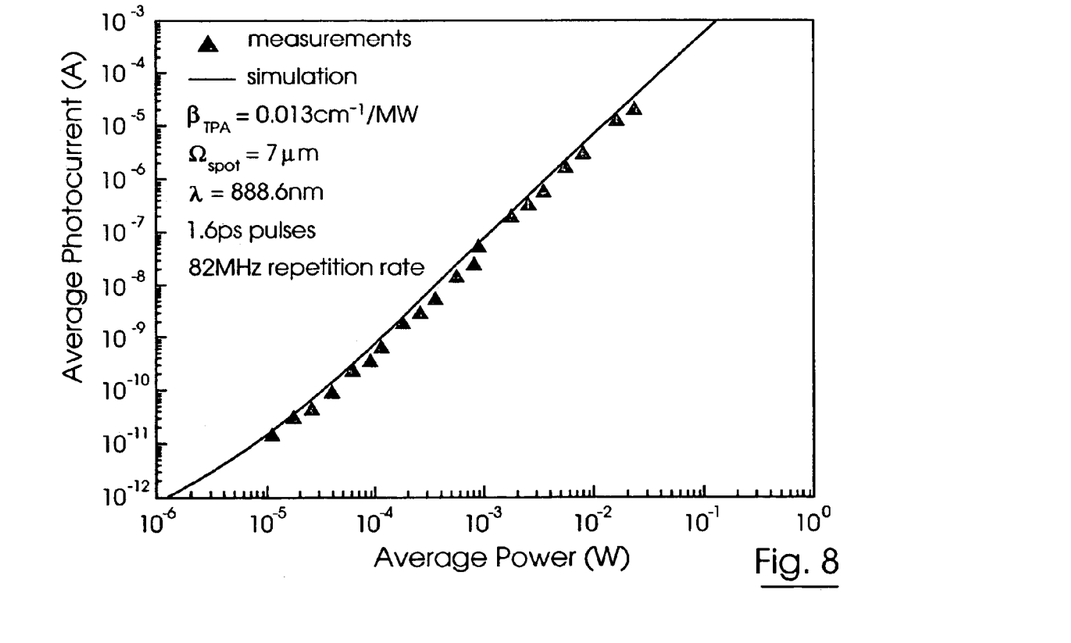
FIG. 8 is a graphical representation of measurement and simulation of the non-linear photocurrent response plotted against incident optical power for the semiconductor photodetector of FIG. 1.

FIG. 8 which illustrates a plot of the log of the average photocurrent against the log of the average power of the semiconductor photodetector 1 shows the curve as having a slope of approximately 2 which indicates that the detector is operating as a Two-Photon Absorption device. If the device were operating as a single photon absorption device the slope of the curve would be approximately 1.

Figure 7:
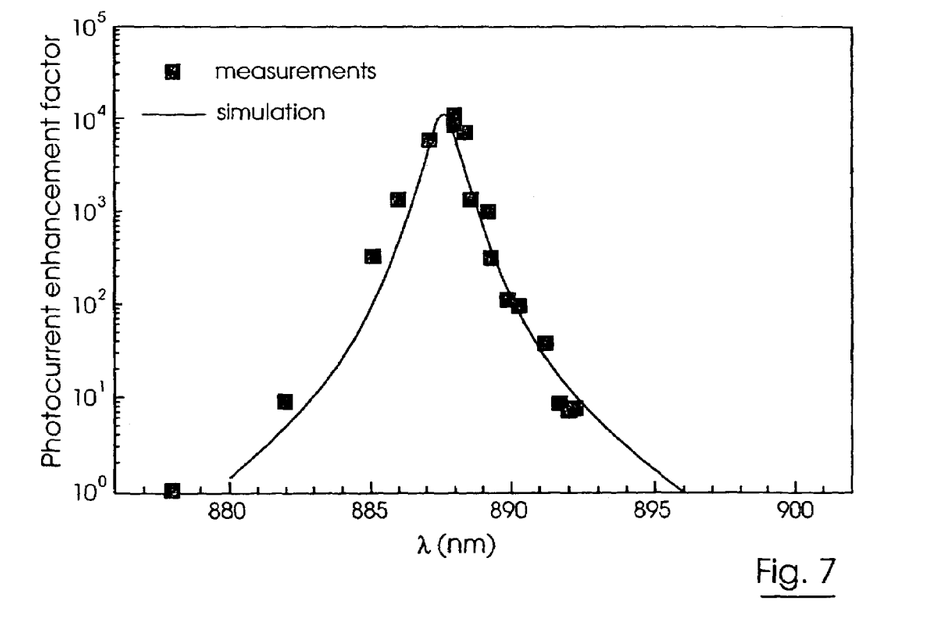
FIG. 7 is a graphical representation of measurement and simulation of photocurrent across the resonance of the semiconductor photodetector of FIG. 1.

Providing the active region in a resonator rather than a waveguide leads to a significant reduction of the capacitance of the device. The main drawback of using a Fabry-Pérot device as the resonator is the precise control of the wavelength pulses, since the resonance has a certain spectral bandwidth. Results show that using pulses of 1.6 picosecond duration at a wavelength of 886.6 nm, no significant degradation of the photocurrent enhancement factor occurs. FIG. 7, which illustrates a waveform of average photocurrent response plotted against average power of the photodetector shows a photocurrent enhancement factor of more than 10000 was obtained in good agreement with the simulations, making the 0.27 μm active Two-Photon Absorption region as efficient as a 2.7 mm one. Moreover, good quality Two-Photon Absorption waveguides are difficult to obtain and a critical length of 2 mm showing saturation of the photocurrent was obtained by Skovgaard et al, in 1998 *Optics Communications*, Vol. 153, pp. 78-82, 'Two-photon conductivity in semiconductor waveguide autocorrelators'.

Figure 4:
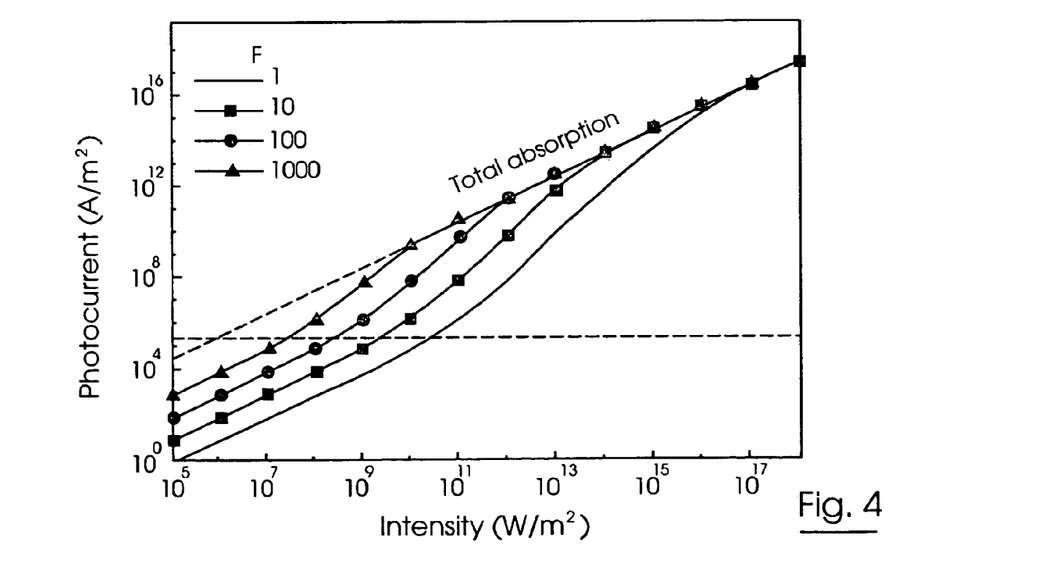
FIG. 4 is a graphical representation of theoretical photocurrent plotted against optical intensity for different enhancement factors based on the semiconductor photodetector of FIG. 1.
Figure 5:
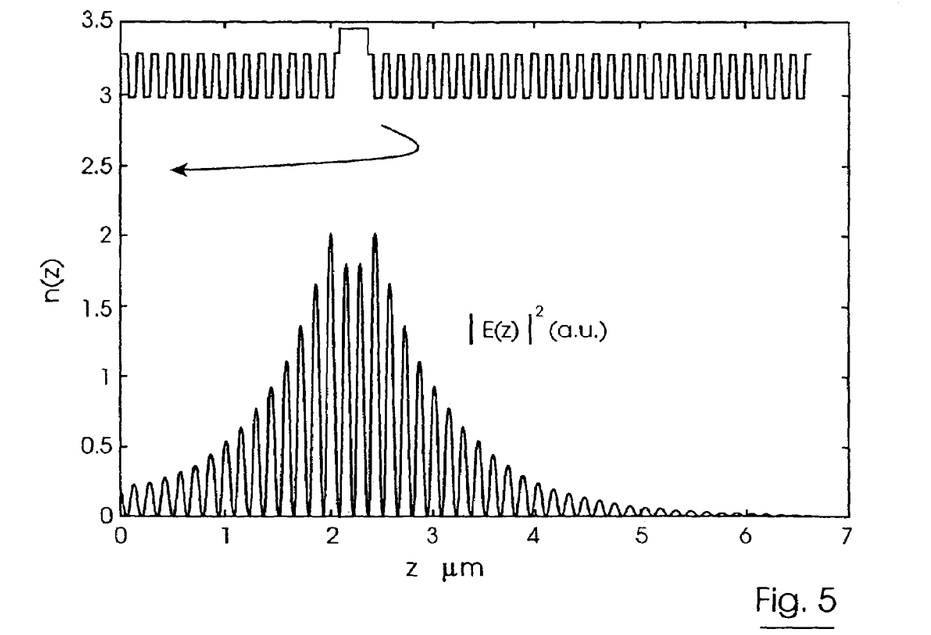
FIG. 5 is a graphical representation of the refractive index and electric field modulus squared simulation of the semiconductor photodetector of FIG. 1.
Figure 6:
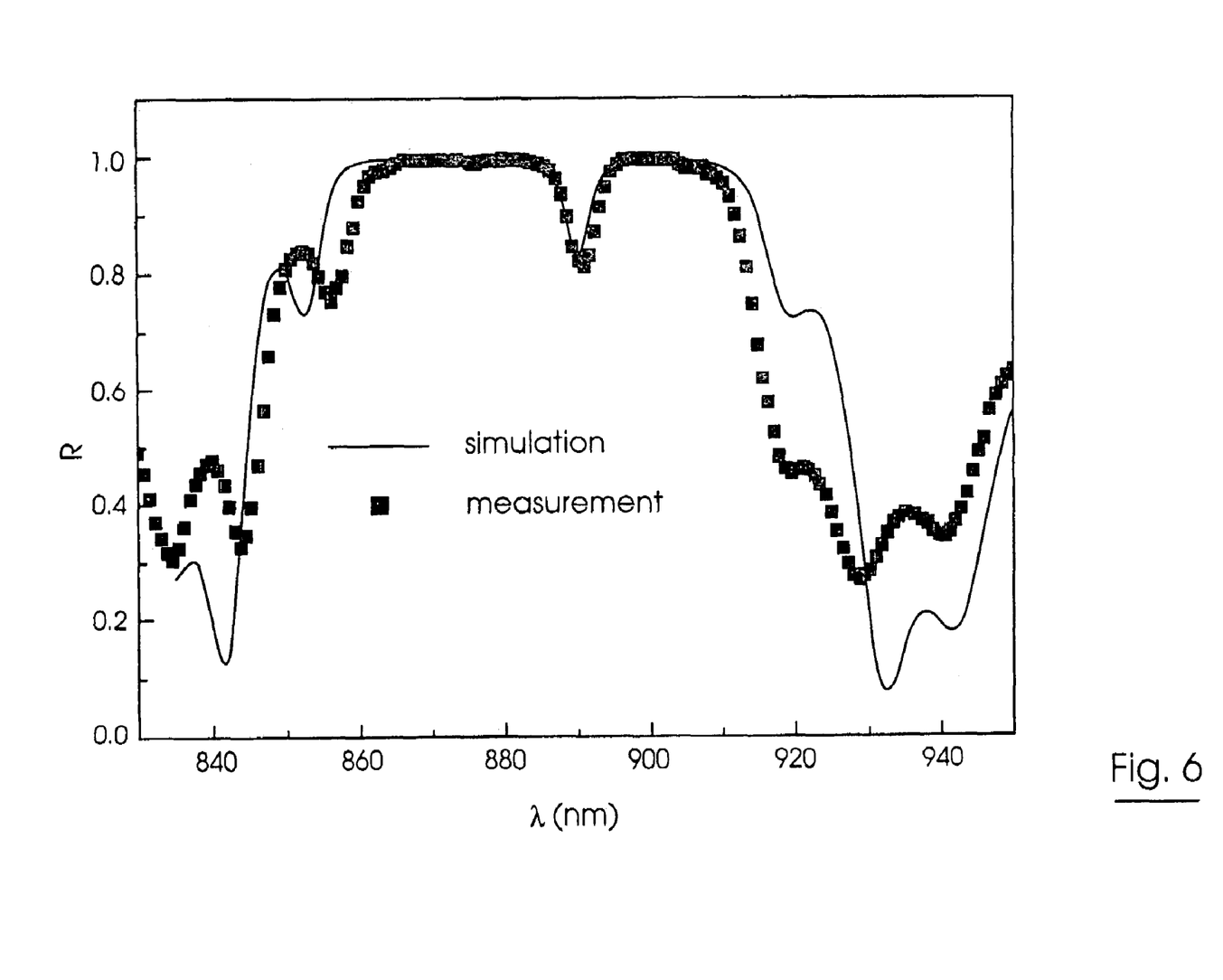
FIG. 6 is a graphical representation of measurements and simulations of optical reflectivity of the semiconductor photodetector of FIG. 1.

In FIG. 4 the theoretical photocurrent versus optical intensity are plotted for different enhancement factors of a microresonator for a 1 μm active region and a Two-Photon Absorption coefficient of $0.02$ cm$^{-1}$/MW, in this simulation the linear absorption is chosen to be a=0.1 cm$^{-1}$. The enhancement factors F are 1, 10, 100 and 1,000. From this it can be seen that the Two-Photon Absorption photocurrent is enhanced when the micro-resonator is present and that enhancement increases with resonator finesse.

Figure 9:
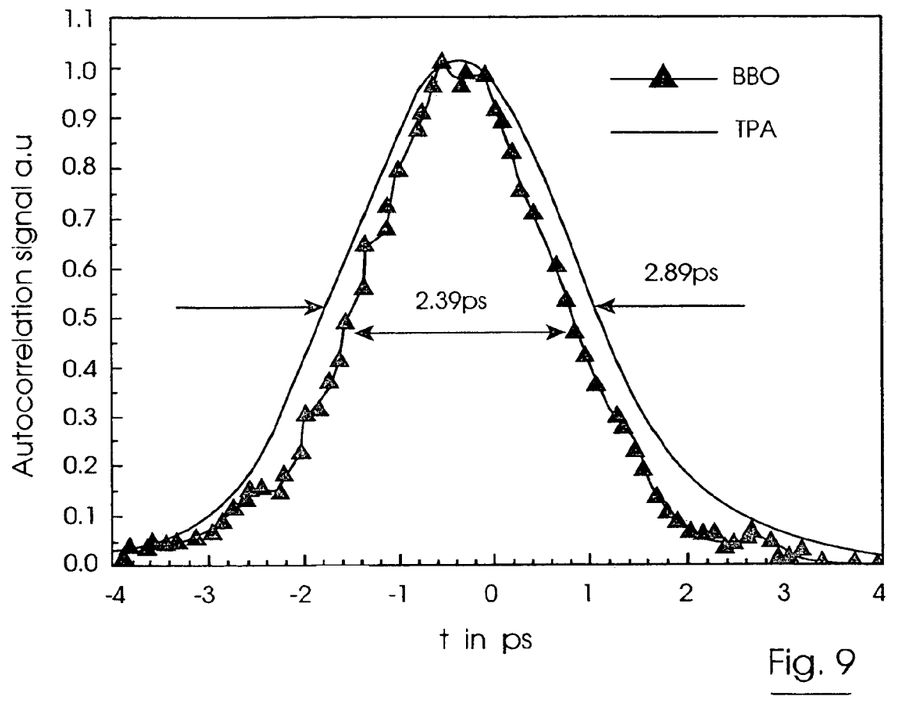
FIG. 9 is a graphical representation of measurement of the time response of the semiconductor photodetector compared with the time response of a non-linear second harmonic optical crystal, beta barium borate ("BBO")

The time response of the semiconductor photodetector is illustrated in FIG. 9. From this it can be seen that although there is a large enhancement of the photocurrent as illustrated in FIG. 7, there is also a modest increase in the time response of the photodetector. The response time of the photodetector which is a convolution of the actual light pulse duration used and the response time of the photodetector is measured to be 2.89 picoseconds, full width at half maximum. The laser pulse duration when measured using autocorrelation by second harmonic generation in a non-linear BBO crystal was 2.39 picoseconds full width half maximum. This compares with the value of 2.39 picoseconds measured with a non-linear BBO crystal in which there is no enhancement effect.

Figures 10, 11, 12:
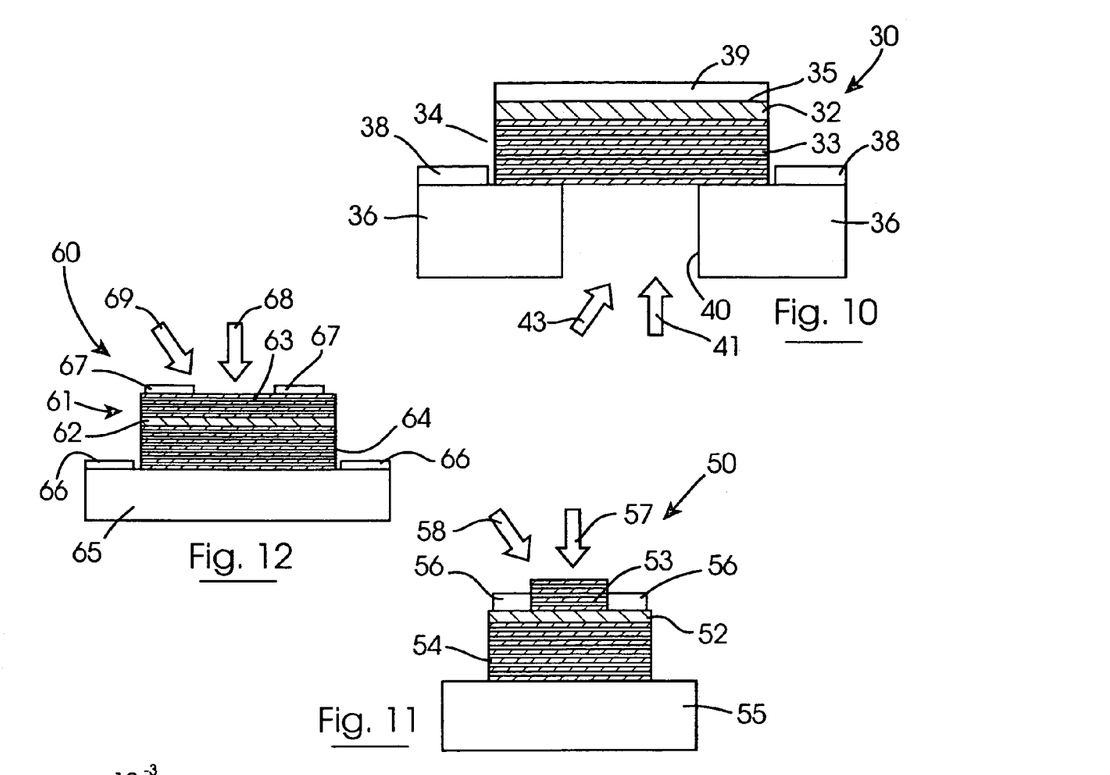
FIG. 10 is a side view of a semiconductor photodetector according to another embodiment of the invention.
FIG. 11 is a view similar to FIG. 10 of a semiconductor photodetector according to another embodiment of the invention.
FIG. 12 is a view similar to FIG. 10 of a semiconductor photodetector according to another embodiment of the invention.

Referring now to FIG. 10, there is illustrated a semiconductor photodetector according to another embodiment of the invention which is indicated generally by the reference numeral 30. In this embodiment of the invention the semiconductor photodetector 30 is of Schottky construction, which will be well known to those skilled in the art. The photodetector 30 comprises an active semiconductor region 32 located between a front mirror 33 comprising a plurality of dielectric Bragg mirror pairs 34 and a rear metal mirror 35. The Bragg mirrors 34 are located on a substrate 36. Electrodes 38 and 39 are provided on the substrate 36 and on top of the rear mirror 35, respectively, across which the voltage change resulting from the detection of light of the predetermined wavelengths is developed. The light signal which is indicated by the reference numeral 41 is directed through an opening 40 in the substrate 36 perpendicularly to the Bragg mirror pairs 34. The pump beam which is indicated by the reference numeral 43 is directed at the Bragg mirror pairs 34 through the opening 40 in the substrate 36 at an angle to the light signal 41. However, due to the symmetry of the photodetector 30, the positions of the light signal and the pump beam may be interchanged.

Otherwise, operation of the detector 30 is similar to the detector 1.

Referring now to FIG. 11, there is illustrated a semiconductor photodetector also according to the invention, indicated generally by the reference numeral 50. In this embodiment of the invention the semiconductor photodetector is of MSM construction, namely, Metal Semiconductor Metal construction comprising an active region 52 located between a front mirror 53 and a rear mirror 54, both of which are formed by dielectric Bragg mirror pairs. The rear Bragg mirror pairs 54 are supported on a substrate 55. Electrodes 56 are located on the active region 52 across which the voltage change is developed resulting from the detection of light of the predetermined wavelengths. The light signal which is indicated by the reference numeral 57 is directed perpendicularly to the front Bragg mirror pairs 53 into the active region 52. The pump beam 58 is directed into the active region 52 through the front Bragg mirror pairs 53 at an angle to the light signal 57. However, due to the symmetry of the photodetector 50 the positions of the light signal and the pump beam may be interchanged. Otherwise, operation of the detector 50 is similar to operation of the detector 1.

Referring now to FIG. 12, there is illustrated a semiconductor photodetector according to a further embodiment of the invention, indicated generally by the reference numeral 60, which in this embodiment of the invention is of PIN construction. The detector 60 comprises an active region 62 located between front and rear mirrors 63 and 64, respectively, both of which are formed by dielectric Bragg mirror pairs. The Bragg mirror pairs of the rear mirror 64 are carried on a substrate 65. A pair of electrodes 66 are located on the substrate 65, and a pair of electrodes 67 are located on the front Bragg mirror pairs 63. The change in voltage resulting from detection of light of the predetermined wavelengths is developed between the pairs of electrodes 67 and the pairs of electrodes 66. The light signal 58 is indicated by the reference numeral 68 and is directed perpendicularly at the front Bragg mirror pairs 63 to the active region 62. The pump beam which is indicated by the reference numeral 69 is directed at the front Bragg mirror pairs 63 to the active region 62 at an angle to the light signal 68. However, due to the symmetry of the photodetector 60, the positions of the light signal and the pump beam may be interchanged. Otherwise, operation of the photodetector 60 is substantially similar to that of the photodetector 1.

Figure 13:
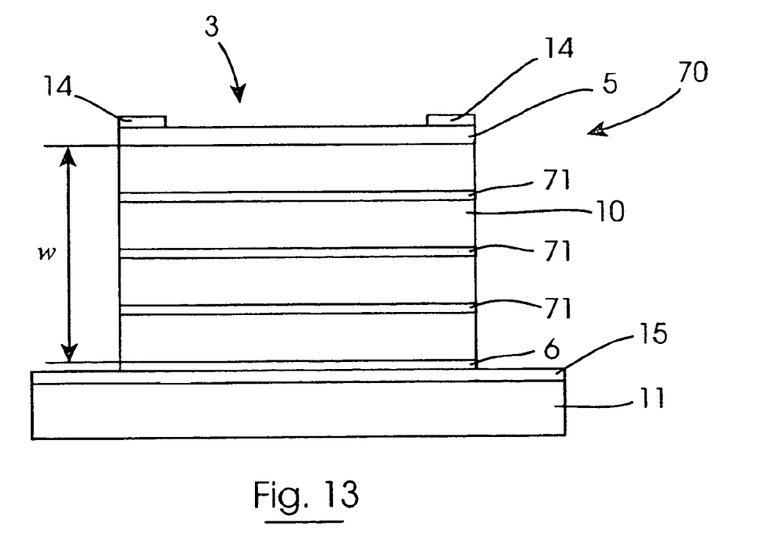
FIG. 13 is a view similar to FIG. 10 of a semiconductor photodetector according to a further embodiment of the invention.

Referring now to FIG. 13, there is illustrated a semiconductor photodetector according to another embodiment of the invention, indicated generally by the reference numeral 70. The photodetector 70 is substantially similar to the photodetector 1, and similar components are identified by the same reference numerals. The main difference between the photodetector 70 and the photodetector 1 is that the photodetector 70 is provided with three active regions 8, each of which is provided as a quantum well 71. The quantum wells 71 are located in the non-active region 10 at locations which correspond to antinodes of the electromagnetic field between the front and rear Bragg mirrors 5 and 6. The material of the quantum wells 71 is selected as already described with reference to the photodetector 1 of FIGS. 1 to 3 for providing Two-Photon Absorption of light of the predetermined wavelength in the quantum wells 71. Either the pump beam or the light signal is directed perpendicularly at the front mirror 5 to pass through the front mirror 5 into the quantum wells 71, and the other of the pump beam and the light signal is directed into the quantum wells 71 parallel to the quantum wells 71 through an end of the photodetector 70, as has already been described with reference to the photodetector 1. Otherwise, the photodetector 70 is similar to the photodetector 1.

It will be appreciated that the photodetectors according to the invention are ideally suited for use as optical switches. When used as an optical switch the photodetector switches out light of the predetermined wavelength from a light beam comprising a plurality of light signals of respective different wavelengths, including a light signal of the predetermined wavelength. On the light signal of the predetermined wavelength being absorbed, a change in the voltage developed across the electrodes occurs.

Thus, the photodetector can act as a converter for converting an optical signal comprising light of the predetermined wavelength to an electrical signal.

While specific semiconductor photodetectors according to the invention have been described, it will be readily apparent to those skilled in the art that photodetectors according to the invention may be of other suitable constructions. The important aspect of the invention is that the active region should be located in a resonator or a micro-resonator, and the resonant frequency of the resonator should be selected so that light of the predetermined frequency resonates in the resonator. This significantly enhances the Two-Photon Absorption of light of the predetermined wavelength, thus significantly enhancing the photocurrent, and in turn the change in voltage resulting from the active region being simultaneously subjected to a light signal of light of the predetermined wavelength and the pump beam, accordingly, the photodetectors according to the invention are particularly suitable for detecting short duration light pulses of a predetermined wavelength in a light signal of relatively low light intensity.

It will also be appreciated that while the wavelength of the pump beam has been described as being slightly less than the predetermined wavelength, in general, the photodetectors perform as described provided the light of the predetermined wavelength and the wavelength of the light of the pump beam conform to the following equations:

$$\frac{hc}{\lambda_p} < E_g;$$

$$\frac{hc}{\lambda_s} < E_g; \text{ and}$$

$$\left[\frac{hc}{\lambda_p} + \frac{hc}{\lambda_s}\right] \leq E_g.$$

As has already been described, it will be readily apparent to those skilled in the art that due to the symmetry of the Two-Photon Absorption effect of the photodetectors according to the invention that the light signal and the pump beam may be interchanged.

While specific semiconductor materials have not been described for the active region, the quantum wells and the non-active region for the photodetectors described with reference to FIGS. 1 to 3 and FIGS. 10 to 13, lists of suitable semiconductor material are set out in the specification prior to the description of the specific embodiments of the invention, and persons of ordinary skill in the art will be able to select appropriate semiconductor materials based on the equations given in the specification.

While the photodetectors of FIGS. 1 to 3 and 10 to 12 have been described as comprising a single active region, and the photodetector of FIG. 13 has been described as comprising three active regions, photodetectors with any desired number of active regions may be provided. It will also be appreciated that each active region may be provided by a quantum well or otherwise. Needless to say, the active regions may be doped or undoped as desired.

It will also be appreciated that electrodes for detecting the change in voltage developed across the active region may be located at any suitable, convenient, desired or appropriate location.

The invention claimed is:

1. A method for detecting a light signal of a predetermined wavelength by two photon absorption using an optically pumped photodetector, the method comprising:
    providing the detector in the form of a resonator adapted to resonate in response to the light signal of the predetermined wavelength, the resonator having a plurality of spaced apart active semiconductor regions at locations substantially corresponding to anti-nodes of a resonating electromagnetic field, each active region defining a conduction band and at least one valence band, the conduction band defining with the corresponding valence band closest thereto an energy bandgap,
    selecting the material of the active regions so that the energy bandgap of each active region is such that the photon energy of the light signal of the predetermined wavelength is less than half of the energy gap of the bandgap,
    pumping the active regions with a pump light beam, the photon energy of which is not less than the energy gap of the band gap of each active region less the photon energy of the light signal of the predetermined wavelength, so that when the light signal of the predetermined wavelength is received simultaneously with the pump light beam a photon is absorbed by each active region from each of the light signal and the pump light beam to transfer an electron across the energy bandgap from the valence band to the conduction band of the corresponding active region,
    directing the light signal into the active regions, and
    monitoring the voltage across the active regions for detecting a change in voltage indicative of the light signal being of a predetermined wavelength.

2. A method for operating an optical switch comprising a semiconductor photodetector, whereby the semiconductor photodetector is adapted for absorbing light of a predetermined wavelength and comprises: a resonator adapted to resonate in response to a light signal of light of the predetermined wavelength, the resonator comprising: a pair of spaced apart mirrors, a non-active region located between the mirrors, and a plurality of spaced apart active regions located in the non-active region for receiving the light signal and a pump light beam, the active regions being provided in the non-active region at locations corresponding to anti-nodes of an electromagnetic field resonating between the mirrors, each active region defining a conduction band and at least one valence band, the conduction band of each active region defining with the corresponding valence band closest to the conduction band an energy bandgap, the width of the energy bandgap being such as to require absorption of more than one photon to effect transition of one electron from the valence band to the conduction band, so that when the light signal of the predetermined wavelength is received by each active region simultaneously with the pump light beam, a photon is required from each of the light signal and the pump light beam to transfer an electron across the energy bandgap from the valence band to the conduction band of each active region to produce a detectable voltage change across the active regions indicative of the light signal of the predetermined wavelength, the optical switch is being responsive to the voltage change produced across the active regions of the resonator in response to light of the predetermined wavelength being absorbed by the photodetector for outputting an electrical signal, the method comprising:
    directing a light beam comprising a plurality of co-propagating signals of respective different wavelengths at the photodetector, and
    monitoring the output of the optical switch for detecting an electrical signal indicative of the light beam comprising a light signal of the predetermined wavelength.

3. A method as claimed in claim 2 in which the non-active region is substantially non-absorbing of light of the predetermined wavelength.

4. A method as claimed in claim 1 in which each active region is of a material having non-linear absorbing characteristics of light in the predetermined wavelength.

5. A method as claimed in claim 1 in which each active region is of a material so that the active region does not substantially exhibit linear absorbing characteristics of light in the predetermined wavelength.

6. A method as claimed in claim 1 in which each active region is of material so that the energy bandgap of the active region is such that the photon energy of the light signal of the predetermined wavelength is less than half of the energy gap of the bandgap, and the wavelength of the light of the pump beam is selected so that the photon energy of the light of the pump beam is not less than the energy gap of the bandgap less the photon energy of the light of the predetermined wavelength.

7. A method as claimed in claim 1 in which each active region is of material so that the width of the energy bandgap of the active region is such as to minimise single photon absorption of light at the predetermined wavelength.

8. A method as claimed in claim 1 in which each active region is undoped.

9. A method as claimed in claim 1 in which each active region is doped.

10. A method as claimed in claim 2 in which the photodetector is a direct bandgap semiconductor.

11. A method as claimed in claim 10 in which each active region is of material selected from any one or more of the following materials and any one or more of their alloys:
    Gallium arsenide
    Indium phosphide
    Indium arsenide
    Aluminium gallium arsenide
    Gallium nitride
    Aluminium nitride
    Zinc selenide
    Zinc sulphide.

12. A method as claimed in claim 2 in which the photodetector is an indirect bandgap semiconductor.

13. A method as claimed in claim 12 in which each active region is of material selected from any one or more of the following materials and any one or more of their alloys:

Silicon

Germanium

Gallium phosphide.

14. A method as claimed in claim 2 in which the photodetector is a direct one photon forbidden bandgap detector at the wavelength of the light of the predate predetermined wavelength.

15. A method as claimed in claim 1 in which each active region is provided by a quantum well.

16. A method as claimed in claim 2 in which the effective spacing between the mirrors is approximately half the wavelength of the light of predetermined wavelength or a harmonic thereof.

17. A method as claimed in claim 2 in which the mirrors are of respective reflectivities for simultaneously maximising the detection of the light of the predetermined wavelength and for preventing detection of light of other wavelengths.

18. A method as claimed in claim 2 in which at least one of the light signal and the pump light beam is directed into the active regions through one of the mirrors.

19. A method as claimed in claim 18 in which the reflectivity of the mirror through which the at least one of the light signal and the pump beam is passed is less than the reflectivity of the other mirror.

20. A method as claimed in claim 2 in which the mirrors are of respective reflectivities so that light in the light signal of wavelengths other than the predetermined wavelength passes through the detector substantially unimpeded.

21. A method as claimed in claim 1 in which the pump beam and the light signal are directed at the active regions at an angle to each other.

22. A method as claimed in claim 2 in which the photodetector is adapted for detecting a light signal comprising pulsed light of the predetermined wavelength where the duration of each pulse is in the range of 1 femtosecond to 500 picoseconds.

* * * * *